United States Patent
Hammerschmidt et al.

(10) Patent No.: US 11,550,001 B2
(45) Date of Patent: Jan. 10, 2023

(54) SAFETY MECHANISM MONITORING OF AUTOCALIBRATED COMPENSATION PARAMETERS

(71) Applicant: Infineon Technologies AG, Neubiberg (DE)

(72) Inventors: Dirk Hammerschmidt, Finkenstein (AT); Udo Hafner, Klagenfurt (AT); Benjamin Kollmitzer, Pörtschach (AT)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 16/788,704

(22) Filed: Feb. 12, 2020

(65) Prior Publication Data

US 2021/0247466 A1 Aug. 12, 2021

(51) Int. Cl.
  *G01R 33/00* (2006.01)
  *G01B 7/30* (2006.01)
  *G06F 11/00* (2006.01)

(52) U.S. Cl.
  CPC .......... *G01R 33/0035* (2013.01); *G01B 7/30* (2013.01); *G01R 33/0082* (2013.01); *G06F 11/00* (2013.01)

(58) Field of Classification Search
  CPC .......... G06F 11/00; G01R 31/00; G01R 35/00
  See application file for complete search history.

(56) References Cited

U.S. PATENT DOCUMENTS

| | | | |
|---|---|---|---|
| 9,140,580 B2 | 9/2015 | Bielski et al. | |
| 10,145,882 B2* | 12/2018 | Rasbornig | B60T 8/885 |
| 10,260,908 B2 | 4/2019 | Mayer et al. | |
| 10,725,068 B2 | 7/2020 | Gafforelli et al. | |
| 2015/0185050 A1* | 7/2015 | Stothers | G01D 3/08 324/713 |
| 2016/0139229 A1* | 5/2016 | Petrie | G01D 5/142 324/252 |
| 2017/0122782 A1* | 5/2017 | Wittkop | G01L 27/00 |

(Continued)

FOREIGN PATENT DOCUMENTS

| | | |
|---|---|---|
| CN | 102901479 A | 1/2013 |
| CN | 105759718 A | 7/2016 |

(Continued)

*Primary Examiner* — Jermele M Hollington
*Assistant Examiner* — Temilade S Rhodes-Vivour
(74) *Attorney, Agent, or Firm* — Harrity & Harrity, LLP

(57) ABSTRACT

An autocalibration method includes generating at least one sensor signal in response to measuring a physical quantity; compensating the at least one sensor signal based on at least one compensation parameter to generate at least one compensated sensor signal; generating the at least one compensation parameter based on the at least one sensor signal or the at least one compensated sensor signal; comparing each of the at least one compensation parameter to a respective tolerance range; on a condition that each of the at least one compensation parameter is within its respective tolerance range, transmitting the at least one compensation parameter as at least one validated compensation parameter to be used for compensating the at least one sensor signal; and on a condition that at least one of the at least one compensation parameter is not within its respective tolerance range, generating a fault detection signal.

25 Claims, 5 Drawing Sheets

(56) References Cited

U.S. PATENT DOCUMENTS

2018/0335441 A1* 11/2018 Hammerschmidt ...... G01P 3/44
2018/0356474 A1* 12/2018 Hammerschmidt . G01R 33/093

FOREIGN PATENT DOCUMENTS

| CN | 107037746 A | 8/2017 |
| CN | 107687829 A | 2/2018 |
| CN | 108369246 A | 8/2018 |
| CN | 110166049 A | 8/2019 |

* cited by examiner

SAFETY MECHANISM MONITORING OF AUTOCALIBRATED COMPENSATION PARAMETERS

FIELD

The present disclosure relates generally to monitoring autocalibrated compensation parameters, and, more particularly, to monitoring autocalibrated compensation parameters of a device.

BACKGROUND

Today, vehicles feature numerous safety, body, and powertrain applications that rely on magnetic position and angle sensors. A magnetic angle sensor may be used to detect a rotational position or movement of a shaft or other rotatable object. For example, in Electric Power Steering (EPS), magnetic angle sensors can be used to measure steering angle and steering torque for steering wheel sensing. Modern powertrain systems can rely on magnetic angle sensors for camshaft, crankshaft, and transmission applications.

In addition, functional safety of electronic systems in automotive passenger cars is an important topic in the light of increasing automation and semiconductor content of modern cars. It is desirable to have a reliable and safe functionality for the safety critical parts deployed in the system.

One requirement, which may often exist in such safety-critical applications, is that malfunctions of a sensor device have to be detectable by the system, for example by an entity receiving signals from the sensor device. In other words, according to such a requirement it has to be possible to detect, if a sensor device delivers erroneous values, e.g., due to a fault of the sensor device.

In a broader sense, functional safety has the goal of preventing harm to people. Safety mechanisms (SM) monitor certain signals in a system to detect faults that could lead to hazards. Upon fault detection, the system may enter into a safe state to mitigate the risk. The accuracy and extent of this monitoring influences the achievable safety level of the system.

In addition, compensation is the process of correcting non-idealities of a device such as a sensor or an actuator. The parameters determining these corrections are called compensation parameters. A common method to determine the optimal compensation parameters for a certain device is calibration, where the device's output is compared with the output of a more accurate reference device. This limits the applicability of calibration to situations in which such a reference device is available.

Autocalibration, also called ongoing calibration, is a special form of calibration that does not require such a reference device. Quite contrary, autocalibration uses certain properties of the system to automatically optimize the compensation parameters. Therefore, autocalibration can correct certain non-idealities of a device directly in the application (i.e., during operation).

For example, a magnetic angle sensor may generate signals that depend sinusoidally on the angle of the magnetic field with respect to a reference direction. If the magnetic field rotates continuously, the absolute values of the maxima and minima of the sensor's signal should be equal due to the symmetry of the sine-function. Deviations from this property could be, e.g. due to an amplifier offset of the sensor. Analyzing the sensor's signal allows detecting these deviations and optimizing the compensation parameters accordingly, thus improving the sensor's output. However, autocalibration has the potential to mask certain faults of the sensor device, e.g., excessive offsets leading to signal clipping, which could lead to hazardous situations. Additionally, errors in generating the compensation parameters with autocalibration may not be detected, which may further lead to errors in functional safety going undetected as well.

A device and a method that ensures functionally safe autocalibration may be desirable to ensure that the functional benefits of autocalibration do not interfere with functional safety requirements.

SUMMARY

One or more embodiments provide an autocalibration system that includes a sensor device including at least one sensing element, each of the at least one sensing element configured to generate a sensor signal of at least one sensor signal in response to measuring a physical quantity; a compensation device including first processing circuitry configured to receive the at least one sensor signal and at least one compensation parameter, and compensate the at least one sensor signal based on the at least one compensation parameter to generate at least one compensated sensor signal, wherein a different compensated sensor signal is generated for each of the at least one sensor signal; an autocalibration device including second processing circuitry configured to receive the at least one sensor signal or the at least one compensated sensor signal and generate the at least one compensation parameter based on the at least one sensor signal or the at least one compensated sensor signal; and a first safety mechanism including third processing circuitry connected between the compensation circuit and the autocalibration device, wherein the third processing circuitry is configured to compare each of the at least one compensation parameter to a respective tolerance range, and, on a condition that each of the at least one compensation parameter is within its respective tolerance range, transmit the at least one compensation parameter to the compensation circuit as at least one validated compensation parameter, and, on a condition that at least one of the at least one compensation parameter is not within its respective tolerance range, generate a first fault detection signal.

One or more embodiments provide a method of autocalibration that includes generating at least one sensor signal in response to measuring a physical quantity; compensating, by a compensation circuit, the at least one sensor signal based on at least one compensation parameter to generate at least one compensated sensor signal, wherein a different compensated sensor signal is generated for each of the at least one sensor signal; generating, by an autocalibration device, the at least one compensation parameter based on the at least one sensor signal or the at least one compensated sensor signal; comparing each of the at least one compensation parameter to a respective tolerance range; on a condition that each of the at least one compensation parameter is within its respective tolerance range, transmitting the at least one compensation parameter to the compensation circuit as at least one validated compensation parameter, wherein the at least one validated compensation parameter is used for compensating the at least one sensor signal; and on a condition that at least one of the at least one compensation parameter is not within its respective tolerance range, generating a first fault detection signal.

BRIEF DESCRIPTION OF THE DRAWINGS

Embodiments are described herein making reference to the appended drawings.

DETAILED DESCRIPTION

Figure 1:
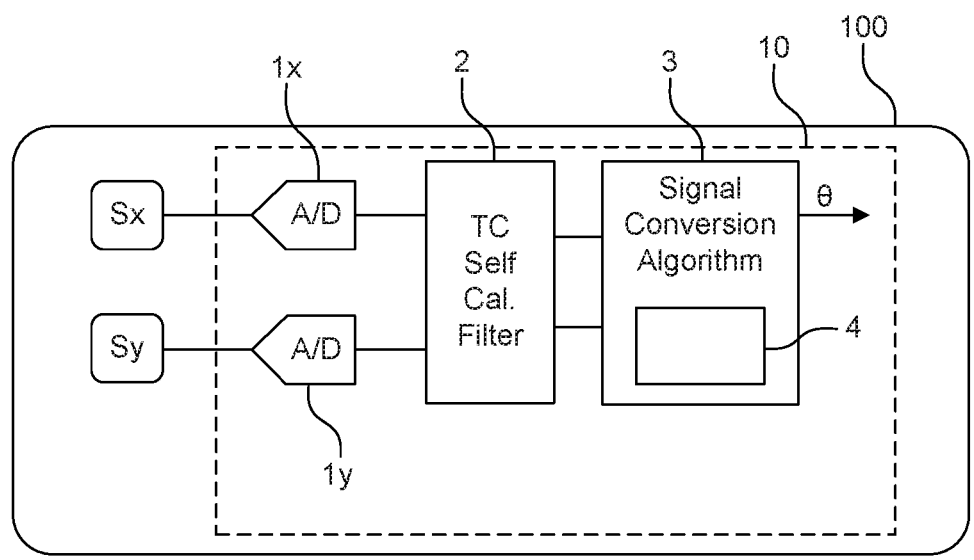
FIG. 1 is a block diagram illustrating a magnetic angle sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto.

A magnetic field sensor, for example, includes one or more magnetic field sensing elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensing element is configured to generate a sensor signal (e.g., a voltage signal) in response to one or more magnetic fields impinging on the sensing element. Thus, a sensor signal is indicative of the magnitude and/or the orientation of the magnetic field impinging on the sensing element.

It will be appreciated that the terms "sensor" and "sensing element" may be used interchangeably throughout this description, and the terms "sensor signal" and "measurement signal" may be used interchangeably throughout this description.

Magnetic sensors provided in the described embodiments may include one or more magnetoresistive sensing elements, which are comprised of a magnetoresistive material (e.g., nickel-iron (NiFe)), where the electrical resistance of the magnetoresistive material may depend on a strength and/or a direction of the magnetic field present at the magnetoresistive material. Here, a sensing element may operate based on an anisotropic magnetoresistance (AMR) effect, a giant magnetoresistance (GMR) effect, a tunnel magnetoresistance (TMR) effect, or the like. As another example, a magnetic sensor may include one or more Hall-based sensing elements that operate based on a Hall-effect. A magnetic angle sensor may include multiple sensing elements of one or more types.

As an additional example, resolver coils may be used as magnetic sensors. However, it should be understood that the induced voltages of the resolver coils have to be demodulated before they can be used as x and y components for the calculation of the angle and the vector length.

A magnetic field component may be, for example, an x-magnetic field component (Bx), a y-magnetic field component (By), or a z-magnetic field component (Bz), where the Bx and By field components are in-plane to the chip, and Bz is out-of-plane to the chip in the examples provided. A sensing element may be sensitive to one component of the magnetic field according to its "sensitivity-axis" or "sensing axis".

For example, measurement values (e.g., voltage) output by a sensing element changes according to the magnetic field strength in the direction of its sensing axis. For example, a sensing element that has its sensitivity-axis aligned with an x-axis is sensitive to x-magnetic field component (Bx), whereas a sensing element that has its sensitivity-axis aligned with a y-axis is sensitive to y-magnetic field component (By). Thus, two sensing elements may be configured to have their sensitivity-axes arranged orthogonal to each other.

According to one or more embodiments, a plurality of magnetic field angle sensors and a sensor circuitry may be both accommodated (i.e., integrated) in the same chip. The sensor circuit may be referred to as a signal processing circuit and/or a signal conditioning circuit that receives one or more signals (i.e., sensor signals) from one or more magnetic field sensing elements in the form of raw measurement data and derives, from the sensor signal, a measurement signal that represents the magnetic field.

In some cases, a measurement signal may be differential measurement signal that is derived from sensor signals generated by two sensing elements having a same sensing axis (e.g., two sensing elements sensitive to the same magnetic field component) using differential calculus. A differential measurement signal provides robustness to homogenous external stray magnetic fields.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensing elements to a digital signal. The sensor circuit may also include a digital signal processor (DSP) that performs some processing on the digital signal, to be discussed below. Therefore, a chip, which may also be referred to as an integrated circuit (IC), may include a circuit that conditions and amplifies the small signal of one or more magnetic field sensing elements via signal processing and/or conditioning. It will also be appreciated that the described embodiments may be divided onto two or more chips. In addition, the sensor circuit may include an optional demodulator that demodulates the x and y components for the case that the measurement is done with an alternating magnetic field as it is done in a resolver. The demodulation can be done in the analog domain, before the ADC, or in the digital domain via a DSP, after the A/D conversion.

A sensor device, as used herein, may refer to a device which includes a sensor and sensor circuit as described above.

FIG. 1 is a block diagram illustrating a magnetic angle sensor 100 according to one or more embodiments. The magnetic angle sensor 100 may include two sensing elements Sx and Sy that are arranged to provide output signals corresponding to two orthogonal components of a magnetic field, such as an x-component of the magnetic field and a y-component of the magnetic field. In this case, the sensing element Sx is configured to sense a sine angle component (e.g., x-component) of the magnetic field and the sensing element Sy is configured to sense a cosine angle component (e.g., y-component) of the magnetic field. Thus, the two sensing elements Sx and Sy are configured to generate two sensor signals (e.g., a voltage signal Vx and a voltage signal Vy) that are phase shifted from each other by 90°.

The magnetic angle sensor 100 also includes a sensor circuit 10 that receives the sensor signals from the sensing elements Sx and Sy for processing and for generation of an angle output signal corresponding to an orientation of the magnetic field. The sensor circuit 10 includes two signal paths: an X signal path and a Y signal path. The signal-X on the X signal path may be in a form of a sinusoidal waveform that represents an angular orientation of the target object, and the signal-Y on the Y signal path may be a similar waveform that is shifted 90° from signal-X. That is, signal-Y is a cosinusoidal waveform that represents an angular orientation of the target object. It will be appreciated that while the examples herein describe the sine waveform as being used as signal-X and the cosine waveform as being used as signal-Y, the opposite may also be true so long as the two signals are phase shifted 90° from each other.

Signal paths X and Y may include an ADC 1$x$ and an ADC 1$y$, respectively, that convert the sensor signal Vx and Vy of the respective signal path into a digital signal for further processing by a remaining portion of the sensor circuit 10.

A DSP may include a digital signal processing device or a collection of digital signal processing devices. The DSP may receive digital signals from the ADCs 1$x$ and 1$y$ and may process the digital signals to form output signals destined for an external device, such as a controller (not illustrated). Each "block" may include one or more processors for processing one or more signals.

The DSP may include a temperature compensation (TC), auto-calibration, and filter block 2, a signal conversion algorithm block 3, and a memory element 4.

The temperature compensation (TC), auto-calibration, and filter block 2 may receive the sensor signals Vx and Vy and a temperature sensor signal T, and perform one or more signal conditioning operations thereon before outputting the compensated sensor signals Vx' and Vy' to the signal conversion algorithm block 3.

In particular, the temperature compensation (TC), auto-calibration, and filter block 2 is configured to receive the sensor signals Vx and Vy for further processing. For example, the temperature compensation (TC), auto-calibration, and filter block 2 may include one or more processors and/or logic units that performs various signal conditioning functions, such as absolute signal conversion, normalization, linearization, auto-testing, and so forth. One or more signal conditioning functions may be performed in combination with a lookup table stored in the memory element 4. In other words, the temperature compensation (TC), auto-calibration, and filter block 2 receives the sensor signals Vx and Vy from the sensing elements Sx and Sy, and converts the sensor signals into compensated measurement signals (i.e., measurement values) Vx' and Vy' that is to be used for further calculations, such as angle calculations and vector length calculations.

Memory element 4 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by the temperature compensation (TC), auto-calibration, and filter block 2. In some implementations, the memory element 4 may store information associated with processing performed by the temperature compensation (TC), auto-calibration, and filter block 2. Additionally, or alternatively, memory element 4 may store configurational values or parameters for the set of sensing elements Sx and Sy and/or information for one or more other elements of the angle sensor 100, such as ADCs 1$x$ and 1$y$.

Thus, the temperature compensation (TC), auto-calibration, and filter block 2 converts the sensor signals Vx and Vy into compensated measurement signals Vx' and Vy'. The outputs of the temperature compensation (TC), auto-calibration, and filter block 2 are provided to a signal conversion algorithm block 3 that is configured to generate an angle signal as an output signal based on the compensated measurement signals Vx' and Vy'. The signal conversion algorithm block 3 may be a processor that is configured to apply an angle algorithm (e.g., $\theta=\arctan(Vy'/Vx')$) stored in memory element 4 for determining the angle of a rotating magnetic field, and generate the angle signal that represents an angular value $\theta$.

Ultimately, the signal conversion algorithm block 3 is configured to receive the sensor signals Vx and Vy or measurement signals derived therefrom (e.g., compensated voltage signal Vx' and compensated voltage signal Vy'). The signal conversion algorithm block 3 is configured to calculate an angle of rotation (θ) of a magnet that generates the magnetic field (and an angle of rotation of a rotatable object to which the magnet is connected) based on the sensor signals or measurement signals corresponding to the two orthogonal components (e.g., θ=arctan(Vy'/Vx')). One or more signal conditioning functions may be performed in combination with a lookup table stored in the memory element 4 to further improve the angle θ.

In some cases, a functional safety check may be implemented in the angle sensor 100. For example, a vector length associated with the sensor signals (e.g., a vector length (VL) equal to $Vx'^2+Vy'^2$) may be monitored during operation of the angle sensor as a functional safety check. In one example, if the vector length remains substantially constant during operation of the angle sensor (e.g., after calibration and/or temperature compensation), then safe operation of the angle sensor may be assumed. In addition to monitoring of the absolute vector length, the change of the vector length may be monitored.

Figure 2A:
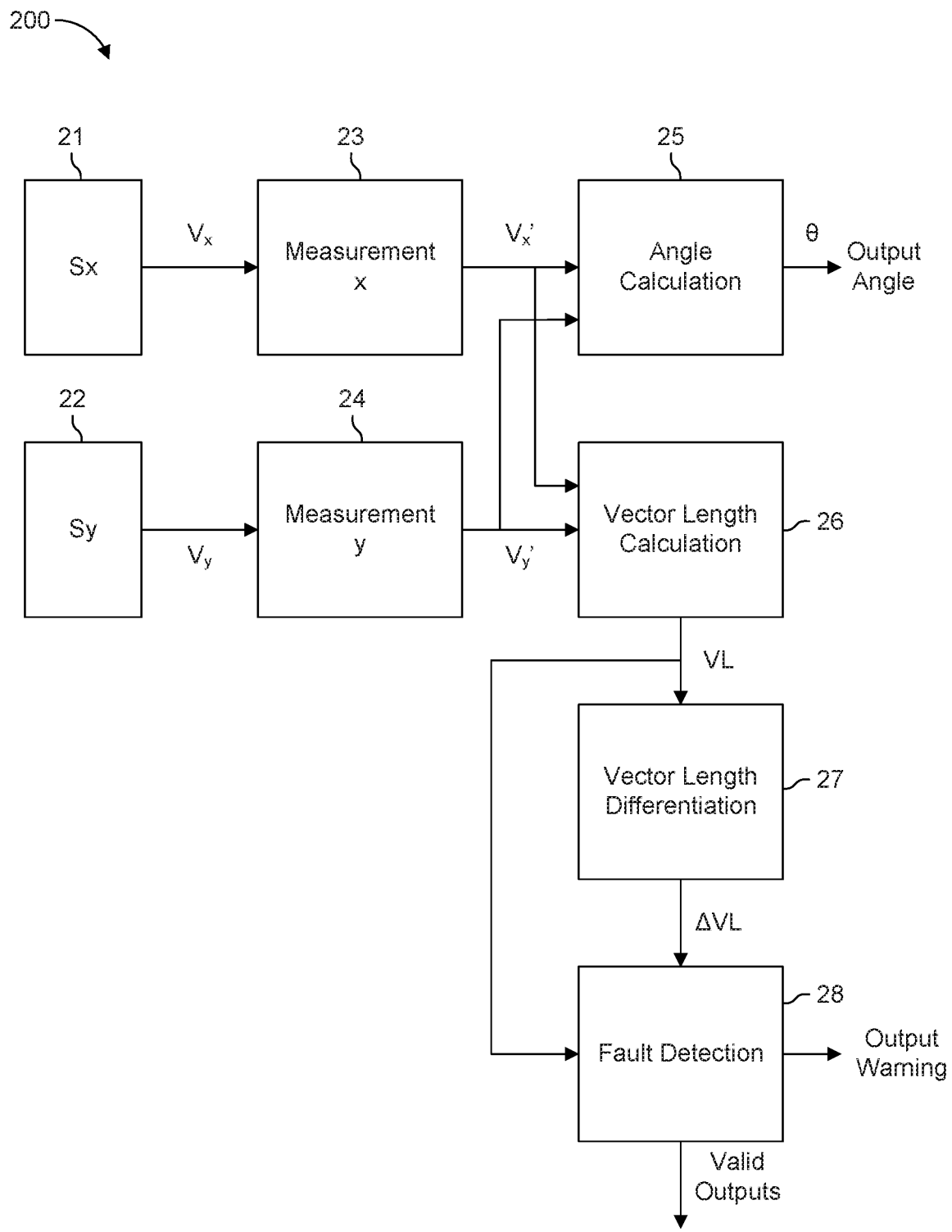
FIG. 2A is a schematic block diagram of a magnetic angle sensor device according to one or more embodiments.

FIG. 2A is a schematic block diagram of a magnetic angle sensor device 200 according to one or more embodiments. The magnetic angle sensor device 200 is a system that may be integrated on one or more chips. The magnetic angle sensor device 200 includes several signal processing circuits and blocks configured to process sensor signals and measurement signals that, as a whole, make up a sensor circuit. It will be appreciated that the signal processing circuits and blocks may be combined into a single processor, microprocessor, DSP, and the like. Alternatively, the signal processing circuits and blocks may be provided in two or more processors, microprocessors, DSPs, and the like. The one or more signal processing circuits and blocks can be integrated on a sensor chip along with the sensing elements or be provided in a microcontroller on system level.

Figure 2B:
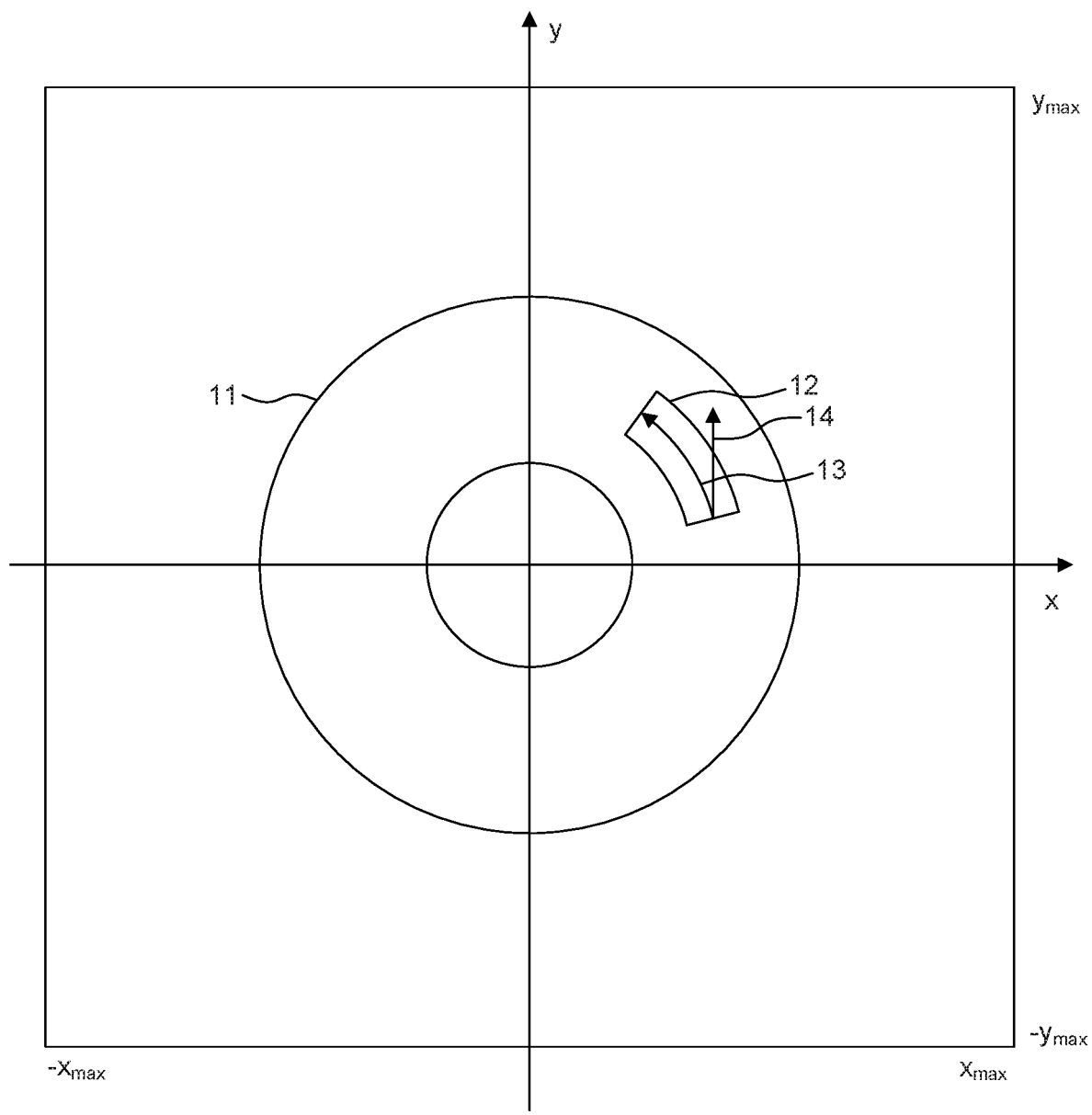
FIG. 2B is a graph illustrating a vector length tolerance region according to one or more embodiments.

FIG. 2B is a graph illustrating a vector length tolerance region according to one or more embodiments. In particular, a vector length is plotted according to the equation $VL=Vx'^2+Vy'^2$. The graph illustrates a vector length plotted in x-y coordinates (i.e., based on the two sensed x and y magnetic field components), where +/-Ymax represent extrema of a Y ADC conversion range and +/-Xmax represent extrema of an X ADC conversion range. Ideally, the length vector should track a circle, but some degree of tolerance is used to account for non-idealities.

The graph illustrates a wide vector length tolerance region 11 and a narrow vector length tolerance region 12. The graph further illustrates a normal length vector 13 with a changing angle and a faulty vector 14, which is "stuck" at an x-value. Since x and y components are constantly changing with a rotating magnetic field, the faulty length vector 14 stuck at an x-value indicates that the sensed x-component is no longer changing. This may be an indication that the sensing element Sx is faulty.

The graph demonstrates that the changing normal length vector 13 remained within the narrow vector length tolerance region 12, indicating normal operation. In contrast, the faulty length vector 14 goes outside the bounds of the narrow vector length tolerance region 12, indicating faulty behavior.

Turning back to FIG. 2A, the magnetic angle sensor device 200 includes a first sensing element (Sx) 21 and a second sensing element (Sy) 22 that generate sensor signals Vx and Vy, as described above.

The magnetic angle sensor device 200 also includes a first compensation circuit 23 and a second compensation circuit 24 that generate measurement signals Vx' and Vy', respectively, as described above. It will be appreciated that the first and the second compensation circuits 23 and 24 may be combined into a single compensation circuit.

The compensation circuits 23 and 24 may each include an ADC (e.g., ADC 1x or ADC 1y) and a temperature compensation (TC), auto-calibration, and filter block 2. Thus, the compensation circuits 23 and 24 each includes one or more processors and/or logic units that performs various signal conditioning and/or compensation functions in order to derive the measurement values Vx' and Vy' from the sensor signals Vx and Vy for use in further calculations. The compensation circuits 23 and 24 may be a microprocessor, such as a DSP, or a portion thereof.

The magnetic angle sensor device 200 further includes an signal conversion algorithm block 25 configured to process the measurement values Vx' and Vy' to generate an angle signal θ as an output angle according to an angle algorithm (e.g., θ=arctan(Vy'/Vx')). The signal conversion algorithm block 25 may be configured to generate and output an angle measurement at different sample times.

The magnetic angle sensor device 200 further includes a vector length calculation block 26 configured to process the measurement values Vx' and Vy' to generate a vector length signal as an output vector length according to a vector length algorithm (e.g., $VL=Vx'^2+Vy'^2$). The vector length calculation block 26 is configured to generate and output a vector length measurement VL at different sample times, which may coincide with the different sample times of the angle measurements. Thus, each vector length measurement VL may also correspond to an angle measurement.

The magnetic angle sensor device 200 further includes a vector length differentiation block 27 configured to calculate a vector length difference between at least two vector length (VL) samples.

In one implementation, the vector length differentiation block 27 is configured to receive two adjacent VL samples (i.e., two samples taken at two consecutive sample times), and calculate a difference therebetween to generate a differential vector length (e.g., $\Delta VL=VL1-VL2$).

In another implementation, the vector length differentiation block 27 is configured to receive two or more adjacent VL samples (i.e., two or more samples taken at consecutive sample times), calculate a differential vector length ($\Delta VL$) between each pair of adjacent VL samples to generate a set of differential vector length values, and further calculate an average of the differential vector lengths ($\Delta VL_{avg1}$) at its output.

In another implementation, the vector length differentiation block 27 is configured to receive two or more adjacent VL samples (i.e., two or more samples taken at consecutive sample times), calculate a differential vector length ($\Delta VL$) between each pair of adjacent VL samples to generate a set of differential vector length values, determine a differential vector length minimum value ($\Delta VLmin$) among the set of differential vector length values, determine a differential vector length maximum value ($\Delta VLmax$) among the set of differential vector length values, and output the minimum value ($\Delta VLmin$) and the maximum value ($\Delta VLmax$) at its output as differential vector lengths to be evaluated.

In another implementation, the vector length differentiation block 27 is configured to receive two or more adjacent VL samples (i.e., two or more samples taken at consecutive sample times), capture minimum and maximum values among the vector length samples, and calculate $\Delta VLmm=VLmax-VLmin$ as the differential vector length.

In another implementation, the vector length differentiation block 27 is configured to receive two or more adjacent VL samples (i.e., two or more samples taken at consecutive sample times), calculate a standard deviation (stdev) of the adjacent VL samples as the differential vector length $\Delta VL_{SD}$ to be evaluated.

The magnetic angle sensor device 200 may further include a fault detector 28 configured to receive the outputs from the vector length calculation block 26 (i.e., VL) and/or the vector length differentiation block 27 (e.g., $\Delta VL$, $\Delta VL_{avg1}$, $\Delta VL$min, $\Delta VL$max, $\Delta VL$mm, and/or $\Delta VL_{SD}$). Using the vector lengths VL, the fault detector 28 may perform an absolute vector length analysis check based on one or more predetermined tolerance thresholds. Using the vector length differentiation outputs, the fault detector 28 may perform a vector length variance analysis check on the received information based on one or more predetermined tolerance thresholds.

For example, if a measured value exceeds predetermined tolerance threshold or a predetermined tolerance range, the fault detector 28 may generate a warning signal indicative of a fault in the angle sensor device 200 and output the warning signal to an external device, such as an external controller.

For example, fault detector 28 may receive the differential vector length ($\Delta VL$), and compare the differential vector length ($\Delta VL$) to a minimum tolerance threshold value and a maximum tolerance threshold value. One or both of the minimum tolerance threshold value and the maximum tolerance threshold value may define a tolerance range or window in which the differential vector lengths are acceptable and indicate normal functionality.

Thus, if the differential vector length ($\Delta VL$) is less than the minimum tolerance threshold value or greater than the maximum tolerance threshold value, the fault detector 28 determines that the differential vector length ($\Delta VL$) is outside of the boundaries of the tolerance range and that a fault may exists within the magnetic angle sensor device 200.

On the other hand, if the if the differential vector length ($\Delta VL$) is equal to or greater than the minimum tolerance threshold value and equal to or less than the maximum tolerance threshold value, the fault detector 28 determines that the differential vector length ($\Delta VL$) is within the boundaries of the tolerance range and that the magnetic angle sensor device 200 is operating within an acceptable margin of error (i.e., the magnetic angle sensor device 200 is operating normally). If the differential vector length ($\Delta VL$) is within the boundaries of the tolerance range, the fault detector 28 determines that the inputs under test are valid and does not to generate a warning signal.

In the case that there is no detected fault, the fault detector 28 permits measurement signals to be output as valid output signals. For example, the fault detector 28 may additionally receive compensated measurement signals Vx' and Vy' (e.g., via vector length calculation block 26) and output the compensated measurement signals as valid output signals to be used by the signal conversion algorithm block 25 for calculating the angle measurement θ on a condition that the operations of sensor elements 21 and 22 are verified as normal based on the described analysis checks.

The fault detector 28 performs a similar evaluation for $\Delta VL_{avg1}$, $\Delta VL$mm, $\Delta VL$min, $\Delta VL$max, and $\Delta VL_{SD}$, where each delta value output by the vector length differentiation block 27 may be evaluated by a minimum tolerance threshold value and a maximum tolerance threshold value. Different minimum and maximum tolerance threshold values may be used depending on the type of delta variable is being evaluated. The delta variables $\Delta VL$min and $\Delta VL$max may be evaluated according to a same set of minimum and maximum tolerance threshold values (i.e., via one tolerance range).

The vector length differentiation block 27 may be configured to change the type of delta variable it calculates and outputs to the fault detector 28. As a result, the fault detector 28 may include a memory element that stores a look-up table that includes different sets of minimum and maximum tolerance threshold values (i.e., different sets of tolerance ranges) mapped to different types of delta variables, and may be configured to select a set of minimum and maximum tolerance threshold values from the look-up table based on the type of delta variable received.

In addition, the fault detector 28 may monitor the absolute vector length based on the vector length measurements VL in addition to monitoring the change of the vector length. To do so, the vector length calculation block 26 and the fault detector 28 may be coupled together such that the vector length calculation block 26 provides the vector length signal comprising vector length measurements VL to the fault detector 28.

The vector length calculation block 26 and the fault detector 28, in combination may represent one type of safety mechanism (SM) used in the described embodiments. Alternatively, a safety mechanism may additionally include the vector length differentiation block 27. Two or more safety mechanisms may be used. For example, one safety mechanism may be provided between the sensor elements 21 and 22 and the compensation circuits 23 and 24 in order to evaluate sensor signals Vx and Vy. Another safety mechanism may be provided as shown in FIG. 2A to evaluate sensor signals Vx' and Vy'.

Figure 3:
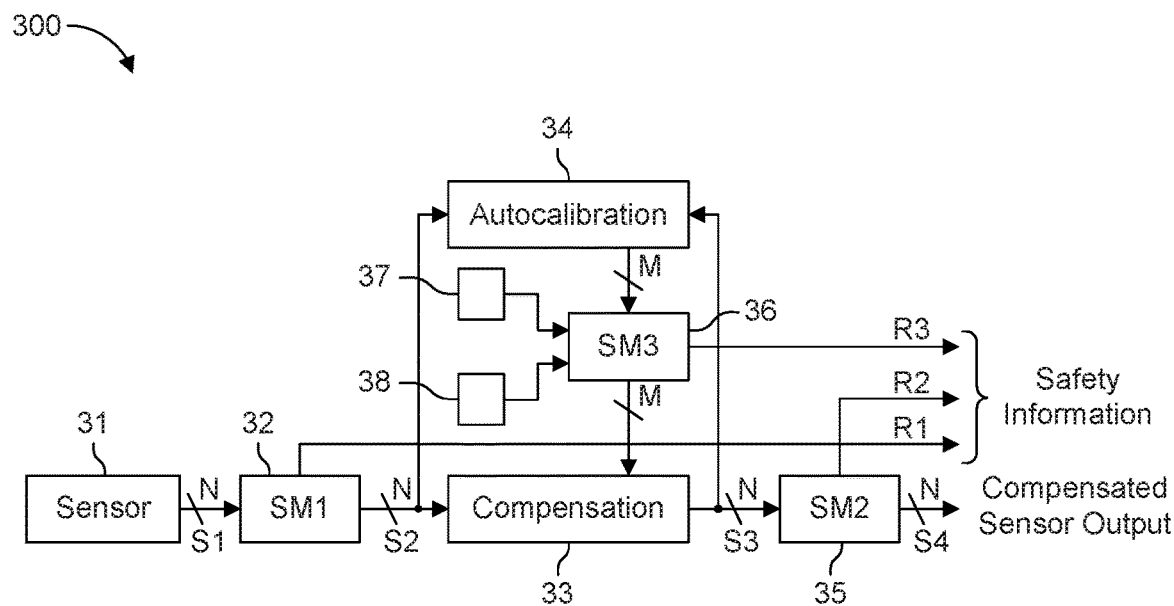
FIG. 3 is a schematic diagram of a calibration system 300 implementing autocalibration for a sensor device according to one or more embodiments.

FIG. 3 is a schematic diagram of a calibration system 300 implementing autocalibration for a sensor device according to one or more embodiments. The calibration system 300 includes a sensor device 31 that generates N sensor signals S1, a first safety mechanism (SM1) 32, a compensation circuit 33, an autocalibration device 34 that automatically generates and outputs M compensation parameters for the compensation circuit 33, a second safety mechanism (SM2) 35, and a third safety mechanism (SM3) 36. Here, N and M are integers equal to or greater than 1. The calibration system 300 may be implemented in a sensor module integrated on a single chip or may be divided onto two or more chips.

The sensor device 31 includes one or more sensor elements. For example, the sensor device 31 may include the first sensing element (Sx) 21 and the second sensing element (Sy) 22 that generate sensor signals Vx and Vy, as described above. The M compensation parameters are optimized by the autocalibration device 34 in order to achieve the optimal compensated sensor output or outputs. For example, the M compensation parameters may include different types of compensation parameters, including, but not limited to, gain (amplitude) value settings, offset values, and angle offset adjustment values.

Safety mechanisms SM1 and SM2 represent two locations used for detecting faults in the sensor device 31 (e.g., for detecting faults in the sensor elements). Each safety mechanism includes one or more processors or processing circuitries configured to perform a validity check on the sensor signals. For example, in the context of FIG. 2A, safety mechanism SM1 is coupled to the output of the first sensing element (Sx) 21 and the second sensing element (Sy) 22 in order to receive N sensor signals S1 (i.e., sensor signals Vx and Vy). The safety mechanism SM1 is configured to perform a validity check on the uncompensated sensor signals S1 using at least one first tolerance range. For example, the safety mechanism SM1 may perform an absolute vector length analysis check based on one or more predetermined tolerance thresholds and/or perform a vector length variance analysis check based on one or more predetermined tolerance thresholds.

The safety mechanism SM1 additionally generates a result signal R1 that indicates the result of the validity check. If a fault is detected, the safety mechanism SM1 generates a warning signal or a fault detection signal as the result signal R1 (i.e., a fault detection signal) as safety information, which may be received by a system controller (not illustrated) for further analysis and action. If no fault is detected, the safety mechanism SM1 provides the validated N sensor signals S2 to the compensation circuit 33 without any fault detection, which performs similar functions described above in reference to compensation circuits 23 and 24. In some circumstances, the safety mechanism SM1 may generate an "all clear" signal or an "OK" signal as the result signal R1, indicating that the validity check has passed.

Thus, the compensation circuit 33 generates N compensated sensor signals S3 (e.g., compensated sensor signals Vx' and Vy'), one for each of the validate N sensor signals S2. The compensation circuit 33 generates the N compensated sensor signals S3 based on the M compensation parameters generated by the autocalibration device 34. In the event that a fault is detected by safety mechanism SM1, the safety mechanism SM1 may deactivate its output of the sensor signals S2. However, if the sensor device is part of a safety critical function in, for example, a vehicle, the safety mechanism SM1 may continue to output the sensor signals S2 for use in the safety critical function. Alternatively, the safety mechanism SM1 may deactivate its output of the sensor signals S2 that are invalid while outputting only those sensor signals S2 that have been verified to be valid.

In the context of FIG. 2A, safety mechanism SM2 is coupled to the output of the compensation circuit 33 in order to receive the N compensated sensor signals S3 (i.e., compensated sensor signals Vx' and Vy'). The safety mechanism SM2 is configured to perform a validity check using at least one second tolerance range. For example, the safety mechanism SM2 may perform an absolute vector length analysis check based on one or more predetermined tolerance thresholds and/or perform a vector length variance analysis check based on one or more predetermined tolerance thresholds. The tolerance range or ranges used by safety mechanism SM2 can be chosen narrower than the tolerance range or ranges used by safety mechanism SM1 because a higher degree of noise, offset, and error must be tolerated by safety mechanism SM1 since it is located upstream from the compensation circuit 33. In contrast, since safety mechanism SM2 receives compensated signals, the amount of noise, offset, and error should be compensated for and thus smaller. In other words, the safety limits for safety mechanism SM2 can be chosen tighter than for safety mechanism SM1 because compensation reduces signal variations caused by sensor non-idealities. This improves the accuracy of safety mechanism SM2 with respect to safety mechanism SM1 and can lead to a safer system. Thus, a smaller tolerance range is used by safety mechanism SM2 in comparison to safety mechanism SM1.

The safety mechanism SM2 additionally generates a result signal R2 that indicates the result of the validity check. If a fault is detected, the safety mechanism SM2 generates a warning signal or a fault detection signal as the result signal R2 as safety information, which may be received by a system controller (not illustrated) for further analysis and action. If no fault is detected, the safety mechanism SM2 provides the validated N compensated sensor signals S4 as valid outputs. For example, the safety mechanism SM2 may provide the validated N compensated sensor signals S4 to a further signal processor, such as the signal conversion algorithm block 25 for calculating the angle measurement θ, or a controller. In some circumstances, the safety mechanism SM2 may generate an "all clear" signal or an "OK" signal as the result signal R2, indicating that the validity check has passed. Additionally, in the event that a fault is detected by safety mechanism SM2, the safety mechanism SM2 may deactivate its output of the sensor signals S4. However, if the sensor device is part of a safety critical function in, for example, a vehicle, the safety mechanism SM2 may continue to output the sensor signals S4 for use in the safety critical function. Alternatively, the safety mechanism SM2 may deactivate its output of the sensor signals S4 that are invalid while outputting only those sensor signals S4 that have been verified to be valid.

The autocalibration device 34 is configured to receive the validated N sensor signals S2 from safety mechanism SM2 and generate M compensation parameters based thereon. The compensation circuit 33 uses the M compensation parameters to perform compensation on the validated N sensor signals S2 to generate the N compensated sensor signals S3.

Additionally, or alternatively, the autocalibration device 34 is configured to receive the N compensated sensor signals S3 from the compensation circuit 33 and generate M compensation parameters based thereon. The compensation circuit 33 uses the M compensation parameters to perform compensation on the validated N sensor signals S2 to generate the N compensated sensor signals S3.

In the case of using the validated N sensor signals S2 for generating the M compensation parameters, the autocalibration device 34 is configured to generate new compensation parameters based on the validated N sensor signals S2 for use in the compensation operation.

In the case of using the N compensated sensor signals S3 for generating the M compensation parameters, the autocalibration device 34 is configured to calculate changes required for currently used calibration parameters based on the N compensated sensor signals S3 and adjust the currently used calibration parameters based on the calculated changes to generate updated or compensated calibration parameters for use in the compensation operation.

In either case, the autocalibration performed by the compensation circuit 33 and the autocalibration device 34 can calibrate out (i.e., mask) certain faults of the sensor device 31, which become undetectable for safety mechanism SM2. Without safety mechanism SM3, this would leave the system with a less accurate safety mechanism SM1 and/or a more accurate but partially blind safety mechanism SM2, leading to reduced diagnostic coverage.

Depending on the system, processing the safety mechanisms SM1 and SM2 can be quite expensive. For example, a safety mechanism for angle sensors is the vector length check described above. The vector length check monitors the magnitude of the electrical vector, whose elements are given by the cosine (X) and the sine (Y) sensor channels. For an ideal sensor, this magnitude stays constant because $\cos^2 θ + \sin^2 θ = 1$. If, for example, one sensor channel experiences a stuck-at fault, the magnitude changes as function of the angle θ, which can be detected by the vector length check.

As a result of the blind spot of safety mechanism SM2 resulting from the autocalibration, safety mechanism SM3 is provided between the autocalibration device 34 and the compensation circuit 33. The safety mechanism SM3 includes one or more processors or processing circuitries configured to perform a validity check on the compensation parameters.

In particular, the safety mechanism SM3 is configured to receive the M compensation parameters determined by the autocalibration device 34 and monitor the received M compensation parameters. The safety mechanism SM3 may compare each of the M compensation parameters with a tolerance range, checking that the compensation parameters stay within certain pre-defined limits. The safety mechanism SM3 may also monitor the change with respect to time of the M compensation parameters to detect sudden changes of these parameters, which could be indicative of the appearance of a fault. As a result, the safety mechanism SM3 can be implemented with minimal overhead. This safety mechanism SM3 effectively detects faults, which are otherwise masked by the compensation and evade detection by safety mechanism SM2, which only monitors the N compensated signals S3. This combination provides excellent accuracy via safety mechanism SM2, together with comprehensive coverage (SM2+SM3) and minimal costs by rendering costly operations in safety mechanism SM1 unnecessary.

The safety mechanism SM3 additionally generates a result signal R3 that indicates the result of the validity check. As a result of the validity check performed by safety mechanism SM3, the safety mechanism SM3 generates a warning signal or a fault detection signal as the result signal R3 on a condition that one of the M compensation parameters exceeds its respective tolerance range. Alternatively, if no fault is detected, the safety mechanism SM3 will output validated M compensation parameters to the compensation circuit 33 to be used for compensating the validated N sensor signals S2. Additionally, if no fault is detected, the safety mechanism SM3 may generate an "all clear" signal or an "OK" signal as the result signal R3, indicating that the validity check has passed. Additionally, in the event that a fault is detected by safety mechanism SM3, the safety mechanism SM3 may deactivate its output of the compensation parameters that are invalid while outputting only those compensation parameters that have been verified to be valid.

Several different implementations for verifying the M compensation parameters are conceivable. First, each of the M compensation parameters may be compared against a corresponding pre-defined static limit. Second, each of the M compensation parameters may be compared against a corresponding adjusted limits, which may be compensated for by an external or environmental factor such as temperature or mechanical stress measured by a sensor 37. While the first approach is simpler, the second approach may yield better accuracy by allowing for tighter safety limit (i.e., narrower tolerance ranges).

Figure 4:
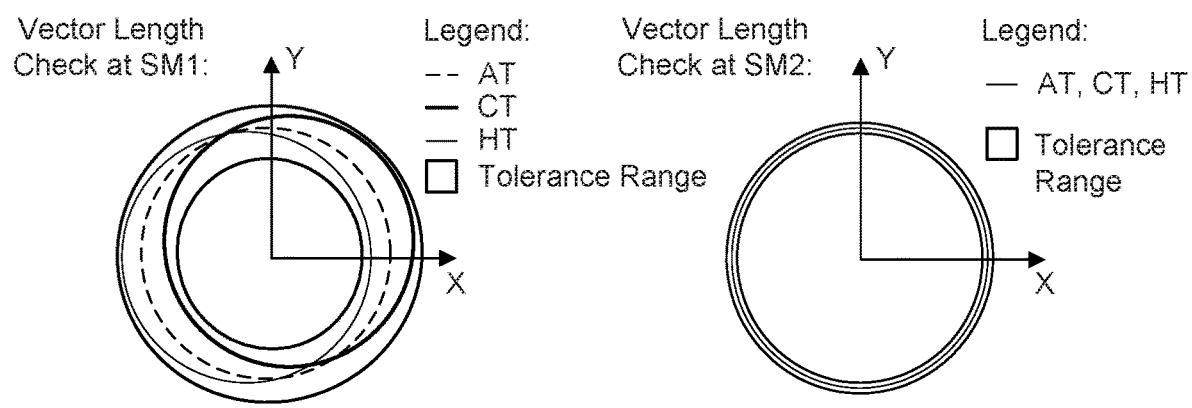
FIG. 4 shows exemplary electrical vectors (X, Y) as function of the angle θ for the vector length check, which is implemented at safety mechanism SM1 (left; using uncompensated sensor signals) or safety mechanism SM2 (right; using compensated sensor signals)

FIG. 4 shows exemplary electrical vectors (X, Y) as function of the angle θ for the vector length check, which are implemented at safety mechanism SM1 (left; using uncompensated sensor signals) or safety mechanism SM2 (right; using compensated sensor signals). X and Y are the components of the electrical vector, which is given by (X, Y). Exemplary signals are drawn as solid lines at ambient temperature (AT), cold temperature (CT), and hot temperature (HT). Safety limits are indicated as a shaded area and represent a corresponding tolerance range for each safety mechanism.

For a magnetic angle sensor, the autocalibration device 34 may autocalibrate offsets and amplitudes of the sine (X) and cosine (Y) sensor channels, and additionally autocalibrate an orthogonality error between sensor signals Vx and Vy. For example, the X and Y sensor channels' offsets could change significantly as function of temperature. If safety mechanism SM1 implements a vector length, the corresponding safety limits would have to include these variations of the offset (see e.g., FIG. 4 (left)). Since errors cannot be detected within the tolerance range, this results in a rather large region of undetected failures within the tolerance range for the vector length check. By implementing the vector length check in safety mechanism SM2, the safety limits can be chosen considerably smaller (see e.g., FIG. 4 (right)). This yields a minimal region of undetected failures for the vector length check due to the narrower tolerance range. However, the vector length check in safety mechanism SM2 now becomes blind to faults caused by variations of the compensation parameters, including offsets, amplitudes, and orthogonality errors.

As countermeasure, safety mechanism SM3 is configured to check the autocalibrated compensation parameters, including amplitudes (Ax and Ay) for sensor channels X and Y, offsets (Ox and Oy) for the sensor channels X and Y, and orthogonality errors ($\varphi$) between the sensor channels X and Y. Thus, the compensation parameters includes at least one of an amplitude compensation parameter for compensating an amplitude of the sensor signal X, an offset compensation parameter for compensating an offset of the sensor signal X, an amplitude compensation parameter for compensating an amplitude of the sensor signal Y, an offset compensation parameter for compensating an offset of the sensor signal Y, and optionally even an orthogonality error compensation parameter for compensating an orthogonality error between the sensor signals X and Y.

Figure 5:
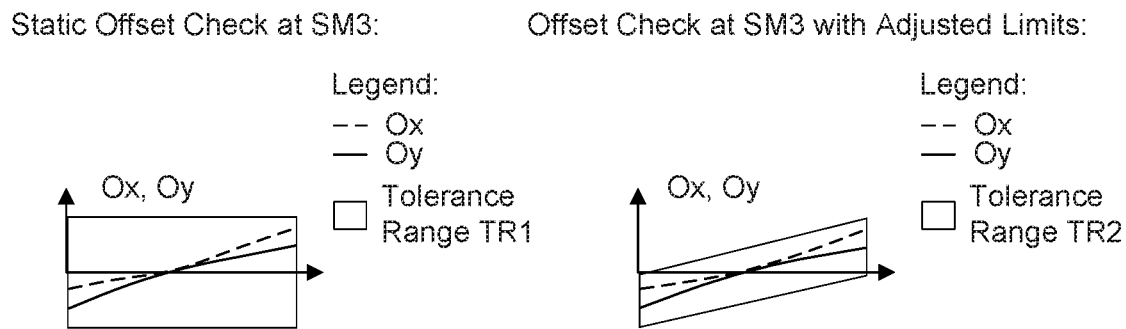
FIG. 5 shows a static offset check (left) and an adjusted offset check (right) according to one or more embodiments.

FIG. 5 shows a static offset check (left) and an adjusted offset check (right) according to one or more embodiments. In particular, a sensor channel offsets (Ox, Oy) may be compared against a static tolerance range TR1 (left) that is independent of an external or environmental factor such as temperature T. As compensation parameters, if safety mechanism SM3 detects either one of the sensor channel offsets (Ox, Oy) set by the autocalibration device 34 to be outside of the static tolerance range TR1, the safety mechanism SM3 generates a warning signal W3, otherwise the sensor channel offsets (Ox, Oy) are output by safety mechanism SM3 as validated compensation parameters.

Alternatively, the sensor channel offsets (Ox, Oy) may be compared against an adjusted tolerance range TR2 (right) that is dependent on an external or environmental factor such as temperature T. In particular, the safety mechanism SM3 receives a sensor signal from sensor 37, such as a temperature signal, and adjusts the tolerance range for the sensor channel offsets (Ox, Oy) based on the temperature measurement. The safety mechanism SM3 then uses the adjusted tolerance range for the validity check of the sensor channel offsets (Ox, Oy). If safety mechanism SM3 detects either one of the sensor channel offsets (Ox, Oy) set by the autocalibration device 34 to be outside of the adjusted tolerance range TR2, the safety mechanism SM3 generates a warning signal W3, otherwise the sensor channel offsets (Ox, Oy) are output by safety mechanism SM3 as validated compensation parameters. Adjusted tolerance ranges can yield more accurate safety mechanisms with improved diagnostic coverage as compared to static tolerance ranges.

Each type of compensation parameter may have a different tolerance range, be it static or adjusted. Whether a tolerance range is static or adjusted may be configured independently for each type of compensation parameter.

In case that the sensor is using Hall plates for the measurement of the x and y magnetic field components, an additional stress compensation may be applied using stress sensor 38 that measures mechanical stress. Sensors 37 and 38 may be representative of a set of sensors that are used in combination by the safety mechanism SM3 to adjust each of the tolerance ranges for respective compensation parameters. Here, the safety mechanism SM3 may adjust the tolerance ranges based on values received from both temperature and stress sensor signals.

In order to increase the diagnostic coverage further, the extracted correction values for the offsets, gains, and temperatures can be captured over temperature at the end-of-line test of the sensor and an extremely narrow monitoring band can be provided for aging effects. In cases where the operation time can be captured, the drift rate of each compensation parameter can also be monitored by safety mechanism 3 and a fault detection message can be issued by safety mechanism 3 if the drift rate is too high which would point to a defect.

In cases where the drifts of the compensation parameters depend on known physical effects, e.g., the stability of a bias magnetic field or the drift of dopants in a semiconductor, it can be used that the drifts must be monotonic, which can be monitored as well.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An autocalibration system, comprising:
a sensor device comprising at least one sensing element, each of the at least one sensing element configured to generate a sensor signal of at least one sensor signal in response to measuring a physical quantity;
a compensation circuit comprising first processing circuitry configured to receive the at least one sensor signal and at least one compensation parameter, and compensate the at least one sensor signal based on the at least one compensation parameter to generate at least one compensated sensor signal, wherein a different compensated sensor signal is generated for each of the at least one sensor signal;
an autocalibration device comprising second processing circuitry configured to receive the at least one sensor signal or the at least one compensated sensor signal and generate the at least one compensation parameter based on the at least one sensor signal or the at least one compensated sensor signal; and
a first safety mechanism comprising third processing circuitry connected between the compensation circuit and the autocalibration device, wherein the third processing circuitry is configured to compare each of the at least one compensation parameter to a respective tolerance range, and, on a condition that each of the at least one compensation parameter is within its respective tolerance range, transmit the at least one compensation parameter to the compensation circuit as at least one validated compensation parameter, and, on a condition that at least one of the at least one compensation parameter is not within its respective tolerance range, generate a first fault detection signal.

2. The autocalibration system of claim 1, wherein the autocalibration device is configured to generate the least one compensation parameter anew based on the at least one sensor signal.

3. The autocalibration system of claim 1, wherein the autocalibration device is configured to generate the least one compensation parameter by adjusting at least one current compensation parameter based on the at least one compensated sensor signal.

4. The autocalibration system of claim 1, wherein the sensor device is a magnetic sensor device and the at least one sensing element includes a first magnetic sensor configured to generate a first sensor signal of the of at least one sensor signal in response to a first component of a magnetic field and a second magnetic sensor configured to generate a second sensor signal of the of at least one sensor signal in response to a second component of the magnetic field.

5. The autocalibration system of claim 4, wherein the at least one compensation parameter includes at least one of a first amplitude compensation parameter for compensating an amplitude of the first sensor signal, a first offset compensation parameter for compensating an offset of the first sensor signal, a second amplitude compensation parameter for compensating an amplitude of the second sensor signal, a second offset compensation parameter for compensating an offset of the second sensor signal, and an orthogonality error compensation parameter for compensating an orthogonality error between the first sensor signal and the second sensor signal.

6. The autocalibration system of claim 1, wherein the respective tolerance range for each of the at least one compensation parameter is static.

7. The autocalibration system of claim 1, wherein:
the third processing circuitry is configured to receive a temperature measurement and adjust the respective tolerance range for each of the at least one compensation parameter based on the temperature measurement.

8. The autocalibration system of claim 1, wherein:
the third processing circuitry is configured to receive a mechanical stress measurement and adjust the respective tolerance range for each of the at least one compensation parameter based on the mechanical stress measurement.

9. The autocalibration system of claim 1, wherein:
the third processing circuitry is configured to measure a drift rate for each of the at least one compensation parameter, compare the drift rate for each of the at least one compensation parameter to a respective drift rate threshold, and generate a second fault detection signal on a condition that at least one drift rate exceeds its respective drift rate threshold.

10. The autocalibration system of claim 1, further comprising:
a second safety mechanism comprising fourth processing circuitry connected between the sensor device and the compensation circuit, wherein the fourth processing circuitry is configured to compare each of the at least one sensor signal to a first tolerance range, and, on a condition that each of the at least one sensor signal is within the first tolerance range, transmit the at least one sensor signal to the compensation circuit and to the autocalibration device as at least one validated sensor signal, and, on a condition that at least one of the at least one sensor signal is not within the first tolerance range, generate a second fault detection signal.

11. The autocalibration system of claim 10, further comprising:
a third safety mechanism comprising fifth processing circuitry connected between the compensation circuit and a system output, wherein the fifth processing circuitry is configured to compare each of the at least one compensated sensor signal to a second tolerance range, and, on a condition that each of the at least one compensated sensor signal is within the second tolerance range, transmit the at least one compensated sensor signal to the system output as at least one validated compensated sensor signal, and, on a condition that at least one of the at least one compensated sensor signal is not within the second tolerance range, generate a third fault detection signal.

12. The autocalibration system of claim 11, wherein the first tolerance range is wider than the second tolerance range.

13. A method of autocalibration, comprising:
generating at least one sensor signal in response to measuring a physical quantity;
compensating, by a compensation circuit, the at least one sensor signal based on at least one compensation parameter to generate at least one compensated sensor signal, wherein a different compensated sensor signal is generated for each of the at least one sensor signal;
generating, by an autocalibration device, the at least one compensation parameter based on the at least one sensor signal or based on the at least one compensated sensor signal;
comparing each of the at least one compensation parameter to a respective tolerance range;
on a condition that each of the at least one compensation parameter is within its respective tolerance range, transmitting the at least one compensation parameter to the compensation circuit as at least one validated compensation parameter, wherein the at least one validated compensation parameter is used for compensating the at least one sensor signal; and
on a condition that at least one of the at least one compensation parameter is not within its respective tolerance range, generating a first fault detection signal.

14. The method of claim 13, wherein generating the at least one compensation parameter includes generating the least one compensation parameter anew based on the at least one sensor signal.

15. The method of claim 13, wherein generating the at least one compensation parameter includes adjusting at least one current compensation parameter based on the at least one compensated sensor signal.

16. The method of claim 13, wherein generating at least one sensor signal comprises:
generating a first sensor signal of the at least one sensor signal in response to a first component of a magnetic field; and
generating a second sensor signal of the at least one sensor signal in response to a second component of the magnetic field.

17. The method of claim 16, wherein the at least one compensation parameter includes at least one of a first amplitude compensation parameter for compensating an amplitude of the first sensor signal, a first offset compensation parameter for compensating an offset of the first sensor signal, a second amplitude compensation parameter for compensating an amplitude of the second sensor signal, a second offset compensation parameter for compensating an offset of the second sensor signal, and an orthogonality error compensation parameter for compensating an orthogonality error between the first sensor signal and the second sensor signal.

18. The method of claim 13, wherein the respective tolerance range for each of the at least one compensation parameter is static.

19. The method of claim 13, further comprising:
adjusting the respective tolerance range for each of the at least one compensation parameter based on a temperature measurement.

20. The method of claim 13, further comprising:
adjusting the respective tolerance range for each of the at least one compensation parameter based on a mechanical stress measurement.

21. The method of claim 13, further comprising:
measuring a drift rate for each of the at least one compensation parameter;
comparing the drift rate for each of the at least one compensation parameter to a respective drift rate threshold; and
generating a second fault detection signal on a condition that at least one drift rate exceeds its respective drift rate threshold.

22. The method of claim 13, further comprising:
comparing each of the at least one sensor signal to a first tolerance range;
on a condition that each of the at least one sensor signal is within the first tolerance range, transmitting the at least one sensor signal to the compensation circuit and the autocalibration device as at least one validated sensor signal; and
on a condition that at least one of the at least one sensor signal is not within the first tolerance range, generating a second fault detection signal.

23. The method of claim 22, further comprising:
comparing each of the at least one compensated sensor signal to a second tolerance range;
on a condition that each of the at least one compensated sensor signal is within the second tolerance range, transmitting the at least one compensated sensor signal to a system output as at least one validated compensated sensor signal; and
on a condition that at least one of the at least one compensated sensor signal is not within the second tolerance range, generating a third fault detection signal.

24. The method of claim 23, wherein the first tolerance range is wider than the second tolerance range.

25. An autocalibration system, comprising:
a sensor device comprising at least one sensing element, each of the at least one sensing element configured to generate a sensor signal of at least one sensor signal in response to measuring a physical quantity;
a compensation circuit comprising first processing circuitry configured to receive the at least one sensor signal and at least one validated compensation parameter that has been validated by a first safety mechanism, and compensate the at least one sensor signal based on the at least one validated compensation parameter that has been validated by the first safety mechanism to generate at least one compensated sensor signal, wherein a different compensated sensor signal is generated for each of the at least one sensor signal;
an autocalibration device comprising second processing circuitry configured to receive the at least one sensor signal or the at least one compensated sensor signal and generate at least one unvalidated compensation parameter based on the at least one sensor signal or the at least one compensated sensor signal; and
the first safety mechanism comprising third processing circuitry connected between the compensation circuit and the autocalibration device, wherein the third processing circuitry is configured to receive the at least one unvalidated compensation parameter, compare each of the at least one unvalidated compensation parameter to a respective tolerance range, and, on a condition that each of the at least one unvalidated compensation parameter is within its respective tolerance range, transmit the at least one unvalidated compensation parameter that has been validated to the compensation circuit as the at least one validated compensation parameter, and, on a condition that at least one of the at least one unvalidated compensation parameter is not within its respective tolerance range, generate a first fault detection signal.

* * * * *